United States Patent
Halahmi et al.

(10) Patent No.: US 7,847,596 B2
(45) Date of Patent: Dec. 7, 2010

(54) ELECTRICAL DEVICE FOR PERFORMING LOGIC FUNCTIONS

(75) Inventors: Erez Halahmi, Bazra (IL); Tamar Ravon, Ramat Aviv (IL); Gilad Diamant, Haifa (IL)

(73) Assignee: NovaTrans Group SA, Vaumarcus NE (CH)

( * ) Notice: Subject to any disclaimer, the term of this patent is extended or adjusted under 35 U.S.C. 154(b) by 0 days.

(21) Appl. No.: 12/474,322

(22) Filed: May 29, 2009

(65) Prior Publication Data

US 2009/0322378 A1    Dec. 31, 2009

Related U.S. Application Data

(63) Continuation of application No. PCT/IL2007/001483, filed on Dec. 2, 2007.

(60) Provisional application No. 60/861,714, filed on Nov. 30, 2006, provisional application No. 60/960,264, filed on Sep. 24, 2007.

(51) Int. Cl.
*H03K 19/00* (2006.01)

(52) U.S. Cl. .................. 326/111; 326/130; 313/336; 313/351

(58) Field of Classification Search .......... 326/111, 326/130; 313/336, 351, 309, 495
See application file for complete search history.

(56) References Cited

U.S. PATENT DOCUMENTS

| | | | |
|---|---|---|---|
| 3,461,297 A | 8/1969 | Cooke-Yarborough | |
| 5,012,153 A | 4/1991 | Atkinson et al. | |
| 5,155,420 A | 10/1992 | Smith | |
| 7,545,179 B2 * | 6/2009 | Diamant et al. | 326/111 |
| 2008/0136455 A1 * | 6/2008 | Diamant et al. | 326/111 |

FOREIGN PATENT DOCUMENTS

WO    2006/077596 A2    7/2006

OTHER PUBLICATIONS

International Search Report, mailed Sep. 16, 2008, from International Application No. PCT/IL2007/001483, filed on Dec. 2, 2007.
International Preliminary Report on Patentability, dated Jun. 3, 2009, from International Application No. PCT/IL2007/001483, filed on Dec. 2, 2007.

* cited by examiner

*Primary Examiner*—Daniel D Chang
(74) *Attorney, Agent, or Firm*—Houston Eliseeva, LLP

(57) ABSTRACT

An electronic device is presented for performing at least one logic function. The device comprises an electron emission based electrode arrangement associated with an electron extractor. The electrode arrangement comprises at least one basic unit including a photocathode, an anode, and one or more gates arranged aside a cavity defined between the photocathode and the anode. Said one or more gates are connectable to a voltage supply unit to be operated by one or more input voltages signals corresponding to one or more logical values, respectively. Said anode is operable as a floating electrode from which an electrical output of the device indicative of a resulted logic function is read. The anode is electrically connected to a photocathode of another cathode-anode unit of the same device, or is connected to an electrode of another electronic device.

26 Claims, 6 Drawing Sheets

ELECTRICAL DEVICE FOR PERFORMING LOGIC FUNCTIONS

RELATED APPLICATIONS

This application is a Continuation of International Application No. PCT/IL2007/001483, filed on Dec. 2, 2007, which in turn claims the benefit under 35 USC 119(e) of U.S. Provisional Application Nos. 60/861,714, filed on Nov. 30, 2006, and 60/960,264, filed on Sep. 24, 2007, all of which are incorporated herein by reference in their entirety.

FIELD OF THE INVENTION

The present invention relates to devices used to perform logic operations in electrical circuits.

BACKGROUND OF THE INVENTION

Digital circuits are used for storing and manipulating digital data. Data is stored in a binary form, and its manipulation is performed via logic operations. Transistors and diodes, the building blocks of digital circuits, function essentially as "switches" that either block or allow current flow. Operated at a bias limit, such switches may be in a state of either cutoff or saturation, corresponding respectively to either a state of practically no current or a state of maximal current. Circuits are designed to make use of this property, so that a transistor or diode serves as physical representation of a binary bit. Digital circuits are often comprised of smaller electronic circuits called "logic gates". Each logic gate is an arrangement of such electrically controlled "switches", and applies a function of Boolean logic on its input signals, i.e. currents and/or voltages. The output is an electrical current or voltage, being itself a representation of a single bit which can in turn control other logic gate(s).

There are several different types of logic gates:

Diode Logic (DL) gates use diodes to perform AND and OR logic functions. They are simple and inexpensive, but they tend to degrade digital signals rapidly, and cannot perform a NOT (inversion) function.

Resistor-Transistor Logic (RTL) gates use transistors operable to combine multiple input signals. These transistors also amplify and invert the resulting combined signal, so an additional transistor is often included to re-invert the output. This combination provides clean output signals and either inversion or non-inversion as needed. RTL gates are almost as simple as DL gates and remain inexpensive, but they draw significant amount of current from the power supply for each gate. Another limitation is that RTL gates cannot switch at high speeds used by modern computers.

Diode-Transistor Logic (DTL) gates use diodes to perform the logical AND or OR function, and then amplify the result with a transistor. These logic gates essentially take DL gates and add a transistor to the output, in order to provide logic inversion and to restore the signal.

An integrated circuit construction makes it more effective to replace the input diodes in DTL gates with transistors. The result is Transistor-Transistor Logic (TTL) gates, which became standard for a number of years. TTL devices use bipolar transistor switches and define the binary values as: 0-0.8V='0', 2-5V='1'. They are inexpensive, but draw a lot of power (individual gates may draw 3-4 mA) and must be supplied with an input voltage of +5V. The low power Schottky versions of TTL chips draw 20% of the power, but are more expensive.

Emitter-Coupled Logic (ECL) gates are designed to operate at very high speeds, by avoiding the "lag" inherent when transistors are allowed to become saturated. The transistors in the logic gate are never completely cutoff or saturated, and remain within their active operating regions at all times. As a result, the transistors do not have a "charge storage" time, and can therefore change states much more rapidly. However, these gates demand substantial amounts of electrical current to operate correctly.

Complementary Metal Oxide Semiconductor (CMOS) devices are made from MOSFETS. They are much lower in power requirements than TTL devices and operate with a wide range of supply voltages (e.g. 3-18V), but are extremely sensitive to static electricity.

PMOS and NMOS (P- and N-channel Metal Oxide Semiconductor) devices offer higher component density than do TTL chips, but are, like CMOS, sensitive to damage from electrical discharge. This family does not have as many TTL chip equivalents as does the CMOS, and is used mainly for VLSI large scale integrated circuits.

WO 2006/077596, assigned to the assignee of the present application, discloses a device for implementing logic function using free electrons moving in vacuum. According to this technique, the device output is created by charging/discharging one or more floating electrodes in response to a certain input field, and the output is read as electric potential(s) on the charged/discharged floating electrode(s). The device includes one or more basic units of electrodes, configured to define vacuum space(s) for free charged particles' propagation, and includes an input assembly for supplying an input signal, and a floating electrode assembly accommodated proximal the input assembly and serving for reading an output signal therefrom. The floating electrode arrangement is configured to define at least one source of the free charged particles and at least one target toward which the charged particles are directed and is chargeable and dischargeable in response to the input signal thereby creating the output of the basic unit.

SUMMARY OF THE INVENTION

There is a need in the art in logic devices for use in electronic circuits, which can have improved performance due to the use of photo- or thermo-emission of electrons from a cathode and which are easy to manufacture, for example using conventional integrated technologies.

The present invention provides a novel logic gate device configured to operate as at least one of NOT, NOR, NAND, OR, AND, and XOR logic gates, utilizing photo- or thermo-emission of electrons from a cathode. The device of the present invention utilizes free space electrons propagation (e.g. in vacuum), and includes an electrode arrangement associated with an electron extractor (illumination and/or temperature source) and with a controllably operated voltage supply.

According to some embodiments of the invention, the arrangement of electrodes includes at least one basic unit, including a photocathode, an anode, one or more gates aside the cathode-anode cavity. The anode is a floating electrode for reading/providing the device output. The anode may be configured to present a photocathode of another cathode-anode unit (with or without gates), or may be a gate of another transistor structure such as CMOS. As for the gate(s) of the basic unit it/they is/are used for supplying input signal(s). Such input signal may be the output of another transistor structure, e.g. CMOS-based structure.

According to some examples of the above embodiments, the arrangement of electrodes includes at least two cathodes (e.g. photocathodes) with at least two respective anodes, and at least one gate. It should be noted that the term "gate" herein refers to an electrode to which input potential is applied and which generally affects (e.g. inhibits or deflects) the flow of electric current. The configuration is such that the anode of one cathode-anode unit and the cathode of the other cathode-anode unit are floating electrodes (no external voltage supply thereto) and are electrically connected to each other. It should be understood that the floating cathode and anode being in electrical communication with one another may actually be implemented as the same cathode-electrode (common plate), but the use of two spaced-apart electrodes electrically connected to one another is a more practical solution simplifying measurement of the output signal therefrom.

In these embodiments, the electrodes of the logic device are arranged in a spaced-apart relationship to define a first electrons' propagation cavity between the first cathode and its associated first anode, and a second electrons' propagation cavity between the second cathode and its associated second anode. The electrodes may be accommodated in a vertical or lateral arrangement of the two units. The gate may be a ring-like electrode, or in the form of aside stripes.

The device input(s), corresponding to logical '0' and/or '1', is/are provided as voltage supply to the gate(s), either from the controllably operated voltage supply unit or from the output of another electronic device (e.g. CMOS structure) as the case may be. The device output is read as the potential at the connected floating electrodes (cathode and anode), which corresponds to the electric current flowing through the device.

Thus, according to some embodiments of the invention, the electrode arrangement can form at least two units, one including a cathode, an anode, and at least one gate; and the other including a cathode and an anode. In the first unit (e.g. triode), the electric current flow is affected by the input potential(s) at the gate(s). This, in turn, affects the electric current flow in the second unit (diode) and affects the output potential read on the anode of the first unit and cathode of the second unit.

The configuration of the first unit corresponds to and determines the logical function performed by the device. In other words, the first unit may have many configurations, each suitable for a different logical function or for different device optimizations, while the second unit (diode) responds and in part determines the device output.

It should be understood that the configuration of the entire device may be such that the output potential values corresponding to the logical values '0' and '1', and the input potential values corresponding to the same logical values, are the same.

In some embodiments, the device is configured to perform the NOT logic function (inverter), and/or to perform the NOR logic function. In general, other logic gates can be constructed using these two, but it may be preferable in terms of area consumption and packing density to have a smaller, dedicated structure for each logical operation. Additional embodiments are depicted for NAND, OR, AND, and XOR logic gates. The same device configuration can be used to selectively implement different logic gates, by using multiple gates and/or additional reference electrode(s) and appropriately supplying voltage thereto to correspond to logic '0' or '1'.

According to some other embodiments of the invention, the logic device comprises one or more basic units, each including a cathode (photocathode), anode, and an array of gates. The gates are arranged in a spaced-apart relationship along a cavity between the cathode and anode. The cathode is exposed to illumination (direct or not), a certain potential voltage is maintained between the cathode and anode, and input signals are supplied to the plurality of gates. An electrical field profile within the cathode-anode cavity varies in accordance to the input signals to the gates, thereby affecting an electric current through the cavity and the electric output at the anode. The anode of the basic unit may present a gate of a CMOS transistor.

According to yet other embodiments of the invention, the logic device includes a cathode (photocathode), a segmented ("pixelized") anode, and an arrangement of gates (in the form of side strips). The latter includes at least two gates spaced-apart from one another along the cavity axis, and at least two gates spaced-apart from one another across the cavity. In this configuration, voltages supplied to the e.g. four such gates provide sixteen different paths of electrons from the cathode to the anode.

In some other embodiments of the invention, the above two concepts can be combined. More specifically, the device includes a photocathode, gates spaced from one another along two perpendicular axes, and a segmented anode, where each of the anode segments is associated with another array of gates arranged in a spaced-apart relationship along the cavity axis closer to the anode plane. This configuration allows for a larger combination of logic functions with AND operator linking them together.

Thus, according to one broad aspect of the invention, there is provided an electronic device for performing at least one logic function, the device comprising: an electron emission based electrode arrangement associated with an electron extractor, the electrode arrangement comprising at least one basic unit including a photocathode, an anode, and one or more gates arranged aside a cavity defined between the photocathode and the anode, wherein said one or more gates are connectable to a voltage supply unit to be operated by one or more input voltages signals corresponding to one or more logical values, respectively, and said anode is operable as a floating electrode from which an electrical output of the device indicative of a resulted logic function is read, the anode having one of the following configurations: being electrically connected to a photocathode of another cathode-anode unit, or being connected to an electrode of another electronic device.

The input signal(s) may be the output of another electronic device.

In some embodiments of the invention, the floating anode is electrically connected to additional cathode which is exposed to the electron extractor and is associated with an additional anode. These may be triode and diode structures, as described above.

According to another broad aspect of the invention, there is provided a electronic device for performing at least one logic function, the device comprising: an electron emission based electrode arrangement associated with an electron extractor comprising a first unit including at least one cathode, at least one anode, and at least one gate, and a second unit including at least one cathode and at least one anode; said at least one gate being connectable to a voltage supply unit to be operated by an input voltage corresponding to at least one logical value respectively; said anode of the first unit and the cathode of the second unit being electrically connected to each other and being a floating electrode from which an electrical output of the device is read indicative of an electric current flowing through the device in response to the applied at least one input voltage.

According to yet another broad aspect of the invention, there is provided an electronic device for performing multiple logic functions, the device comprises one or more basic units, each including a photocathode associated with an electron extractor, an anode, and an arrangement of gates comprising a plurality of gates arranged in a spaced-apart relationship along at least one axis of a cavity between the photocathode and anode, thereby allowing multiple different combination of input signals applied as input voltages on the gates affecting an electric field within the cavity accordingly, thereby affecting an electric output at the anode corresponding to a respective logic function of the input signals.

The anode may be a gate electrode of another electronic device.

The arrangement of gates may include a one-dimensional array of gates extending along the cavity; or in some other embodiments, may include a first array of gates spaced-apart along a first axis, and a second array of gates spaced-apart along a second axis both being substantially perpendicular to the cavity axis. In the latter case the gates operates as a deflector for electrons emitted from the photocathode, thus affecting the electrons' path in accordance with the applied input voltages. The anode may be a segmented electrode defining an array of anode segments, the deflection of the electrons according to the input voltages on the gates directing the electrons to the selected one or more anode segments. The output of the device may thus be defined by connecting the anode segments representing the logical function to be implemented. The arrangement of gates may be located closer to the photocathode plane. In some embodiments, the anode segments is associated with a plurality of the gates arranged in at least one array of gates extending along the cavity close to the anode plane, enabling to increase the variety and complexity of the logic function performed by said device.

Thus, according to yet further aspect of the invention, there is provided an electronic device for performing multiple logic functions, the device comprises a deflection device including a cathode associated with an electron extractor, and an arrangement of gates comprising a plurality of gates arranged in a spaced-apart relationship along at least one axis of a cavity between the photocathode and anode, thereby allowing multiple different combination of input signals applied as input voltages on the gates affecting an electric field within the cavity accordingly, and segmented anode defining an array of anode segments, the deflection of the electrons being according to the input voltages on the gates directing the electrons to the selected one or more anode segments.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The present invention provides novel electronic devices configured to implement various logic functions, such as NOT, NOR, NAND, OR, AND, and XOR. The present invention utilizes free electron propagation (e.g. in vacuum), based on the principles of electron emission from a cathode, which can be photo- or thermo-emission. More specifically, the present invention is used with photocathodes and is therefore described below with respect to this specific implementation, but it should be understood that the invention is not limited to this specific implementation.

According to some embodiments of the invention, the electronic device includes an electrode arrangement defining first and second cathode-anode units and gate(s) within the first cathode-anode unit. The anode of the first unit (with one or more gates) and the cathode of the second unit (diode) are floating electrodes (no external voltage supply thereto) and are electrically connected to each other. The device input(s) is/are supplied to the gate(s), and the device output is read on the floating electrodes and is indicative of the electric current through the device.

Figure 1:
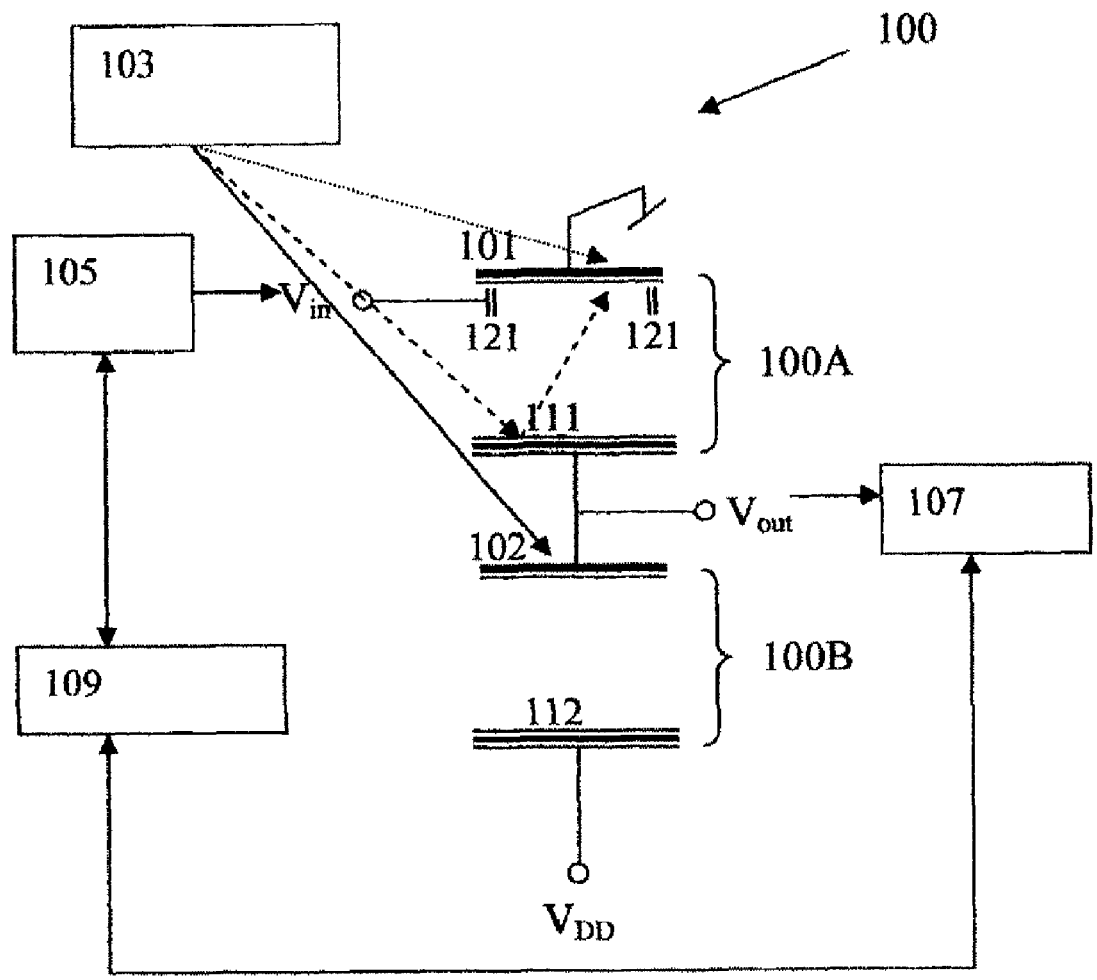
FIG. 1 is a schematic illustration of an example of a logic gate device of the present invention operable as a NOT logic gate.

Reference is made to FIG. 1 showing schematically an example of a logic gate device 100 of the present invention according to the above-described embodiment. In the present non limiting example, device 100 has a substantially cylindrically symmetrical configuration. In the present example, device 100 is configured to operate as a logical inverter (NOT gate).

Device 100 includes an electrode arrangement including two photocathodes 101 and 102, two anodes 111 and 112, and a gate 121 (ring-like electrode whose cross section is shown) between photocathode 101 and anode 111. Photocathode 101 and anode 111 form a first cathode-anode unit 100A, and photocathode 102 and its associated anode 112 form a second cathode-anode unit 100B. Gate 121 is associated with the first cathode-anode unit 100A. Thus, in this example where the single gate is used, the device is formed by triode structure 100A and diode structure 100B. In this example, all the electrodes 101, 121, 111, 102, and 112 are vertically aligned, being located in spaced-apart substantially parallel planes. Anode 111 and photocathode 102 are floating electrodes and are electrically connected between them. A medium within a space between the electrodes of the first and/or second cathode-anode units may contain gas at a desired pressure, or vacuum to a desired degree, although it is preferable that the inter-electrode distances not exceed the mean free path of the charged particles traversing the medium.

Photocathodes 101 and 102 may be exposable to illumination from an illumination source(s) 103. It should be understood that illumination of photocathode 102 provides for discharging it. In operation, photocathode 102 always discharges anode 111. The potential reached at anode 111 (and photocathode 102) is dependant only on the field created by the input voltage(s) on the gate(s). If the input voltage allows electric current to flow through the device, then the voltage at the floating electrode will be about half $V_{DD}$ wherein photocathode 101 is at ground potential and anode 112 is at a certain non-zero potential $V_{DD}$ (as will be described more specifically further below). If the electrons cannot reach the anode 111 then the potential $V_{out}$ at the floating electrode will be about $V_{dd}$. It should be noted that the current determines the speed at which the charging/discharging of the device occurs and therefore determines the speed of the device. The parameters that determine the current intensity are mainly the light power of the illumination source(s), as well as the absolute value of $V_{DD}$ and cathode to anode distances.

The illumination source(s) may be constituted by light emitting unit(s) (composed of one or more light emitters) or by light guiding unit(s) associated with remote light emitter(s), e.g. an optical window e.g. made in a substrate supporting the photocathode layer. The illumination of the photocathode may include direct illumination (as exemplified in FIG. 1 by a solid line with respect to photocathode 102), illumination of the external surface ("back-illumination", as exemplified in the figure by a dashed line with respect to photocathode 101), and/or reflection from the anode (as exemplified in the figure by a dashed line with respect to photocathode 101). The illumination of the photocathodes enables electron emission therefrom.

Photocathode 101 and anode 112 are connected to a controllable voltage supply (which is not specifically shown here). In this depiction, photocathode 101 is at ground potential and anode 112 is at a certain non-zero potential $V_{DD}$. Gate electrode 121 is supplied with an input voltage $V_{in}$ from a voltage supply unit 105, which may be a controllable voltage supply operable by a control unit 109 or may be constituted by the output of another device (which is not specifically shown). The output of device 100 is the depicted output voltage $V_{out}$ which is read by an appropriate electrical detector 107 or which functions as input to another device. The output voltage $V_{out}$ is read as the potential of the connected floating electrodes, and is affected by the electric current flowing through the device in response to the input voltage on the gate. Hence, the detected output voltage is indicative of the electrical current through the device affected by the input voltage signal(s).

As indicated above, device 100 configured to operate as a logical inverter includes two devices: triode 100A (first cathode-anode unit consisting of photocathode 101, anode 111, and gate 121), and diode 100B (second cathode-anode unit consisting of photocathode 102 and anode 112). For the diode, an electric field at photocathode 102 is determined by a potential difference $V_d$ between photocathode 102 and anode 112 and by a distance $D_d$ between them under given illumination of photocathode 102. For the triode, an electric field at photocathode 101, under given illumination thereof, is approximated by the effective potential $V_t = V_{gate} + V_{anode}/\mu$, where $V_{gate}$ is the potential of gate 121 relative to that of photocathode 101, $V_{anode}$ is the potential of anode 111 relative to that of photocathode 101, and $\mu$ is the geometrical factor being constant $\mu > 1$ for a given electrode geometry.

Each of the triode and diode devices has a typical I/V characteristic, on which two points in particular can be defined: one of the maximum current and lowest photocathode-anode voltage (where the anode is negative relative to the photocathode) and one of nearly zero current and high (negative) voltage. The devices' characteristics can be represented, at least to some approximation, by Child's Law, whereby the current flowing through the device is limited by the resultant space-charge. For the diode, electric current $I_d$ is thus proportional to $V_d^{3/2}/D_d^2$. For the triode, a similar relation exists whereby electric current $I_t$ is proportional to $V_t^{3/2}/D_t^2$, where $D_t$ is an effective "distance" between photocathode 101 and anode 111 which depends on the distances between cathode 101, gate 121, and anode 111, and on the geometrical factor $\mu$. In this embodiment, the devices are made so that their effective distances $D_d$ and $D_t$ are similar.

As the electrodes are generally made of different materials (e.g., Au and Al), then, in addition to the applied potential differences, there are contact potential differences that arise between each pair of electrodes being in contact. In the example of FIG. 1, two contact potential differences are to be taken into account: a potential difference between photocathode 101 and anode 111, $V_{CPD\_PA}$, and a potential difference between photocathode 101 and gate 121, $V_{CPD\_PG}$. It should be noted that in this notation, the higher the $V_{CPD}$, the stronger the retarding field that stops the electrons from reaching the anode.

In the following, the logical output '0' is defined so as to correspond to the output voltage $V_{out}$ when there is certain non-zero electric current I>0 flowing through inverter device 100, and the logical output '1' is defined so as to correspond to the output voltage $V_{out}$ when there is no electric current flowing through the device, I=0.

When I>0, then current flows through both the triode 100A and the diode 100B, which are assumed to be operating in the space charge regime. The space charge current is determined according to the above relations, and the photoemission current must be greater for the device to operate in the space charge regime. Therefore, the intensity of illumination (assuming suitable quantum yield of the photocathodes) should be sufficient to generate the required current. Since the effective photocathode-anode distances are selected to be similar in both devices, the output voltage in this case is about half of $V_{DD}$. Therefore, $V_{out} \approx V_{DD}/2$ corresponds to the logical output '0'. It should be noted that the device does not necessarily operate in the space charge regime, but may also operate in a non-space charge limited regime, or a combination of both.

When I=0, both the triode 100A and the diode 100B are under such relative potential conditions that do not allow electrons emitted from photocathode 101, 102 to reach respective anode 111, 112. The triode's anode 111 is electrically connected to the diode's photocathode 102, while both of these electrodes are "floating" (i.e. not connected to a voltage source). The potential on the floating electrode depends on the charge accumulated as a result of electrons that reached anode 111 from photocathode 101, but which cannot escape via photocathode 102. This potential is in fact determined by the maximal kinetic energy $K_{max}$ of the emitted electrons, since when the anode's effective potential relative to the respective photocathode is about $(-K_{max}/e)$ (where e is the electron charge and $K_{max}$ is in electron-volts), no emitted electron is energetic enough to reach the anode.

Electrons cannot escape photocathode 102 when the voltage drop $V_d$ across diode device 100B satisfies a condition that $$V_d = (-K_{max}/e) + V_{CPD\_PA}$$

It should be noted that if $V_{CPD\_PA} > K_{max}/e$ then $V_d$ will remain zero (since the emitted electrons do not have enough energy to reach the anode), but if the initial voltage drop across the diode is greater than $(-K_{max}/e + V_{CPD\_PA})$, then this is a value which $V_d$ will finally reach whereby electrons can no longer escape and I=0.

For the purpose of a numeric example, let us choose $K_{max}/e=0.25V$ and $V_{CPD\_PA}=1.5V$. If, initially, $V_d=0$, then an electron with a kinetic energy of 0.25 eV, which "sees" a retarding field of 1.5V across the device, will reach 0.25/1.5 of the distance $D_d$ between photocathode and the anode and will then return to the photocathode. There will be no transfer of charge, and the voltage drop across the diode will therefore remain zero. If, however, the anode is initially 1.75V more positive than the photocathode, then electrons emitted with a kinetic energy of 0.25 eV will reach the anode. The first electron will reach the anode with a total kinetic energy of 1.75−1.5+0.25=0.5 eV. The transfer of an electron from the photocathode to the anode results in the photocathode becoming more positive (or the anode becoming less positive), and thus decreases the voltage drop across the diode. The amount by which the potential difference between the anode and the photocathode is decreased is derived from the anode-photocathode capacitance: the smaller the capacitance, the greater the potential drop. The photocathode will stop losing electrons once the emitted electrons reach the anode with zero kinetic energy. After this happens, electrons can no longer reach the anode at all. This happens when the following condition is satisfied:

$$V_d-1.5+0.25=0 \rightarrow V_d=1.25V=(-K_{max}/e)+V_{CPD\_PA}.$$

Given the potential drop across the diode when I=0, $V_d=(-K_{max}/e)+V_{CPD\_PA}$, the output voltage can be determined by adding the anode potential $V_{DD}$. Hence, for I=0, the output voltage is $V_{out}=V_{DD}-V_d=V_{DD}+K_{max}/e-V_{CPD\_PA}$, and this corresponds to the logical output '1'.

In order to obtain inversion (i.e. a NOT operation), it is necessary to select appropriate materials and light source energy (or wavelength) so that when the input voltage $V_{in}$ (applied at gate 121) is the one corresponding to logical '0', the output voltage $V_{out}$ is the one corresponding to logical '1', and vice versa. This requirement is summarized in the following Table 1:

TABLE 1

| $V_{in}$ | $V_{out}$ | I |
|---|---|---|
| $V_{DD}/2$ | $V_{DD} + K_{max}/e - V_{CPD\_PA}$ | =0 |
| $V_{DD} + K_{max}/e - V_{CPD\_PA}$ | $V_{DD}/2$ | >0 |

Table 1 is almost correct, but it does not yet take into account the effect of $V_{-CPD\_PG}$, the contact potential difference between photocathode 101 and gate 121 of triode 100A. The effect of $V_{CPD\_PG}$ is essential to create an offset for the applied potential difference between the gate and the photocathode, so that the effective potential difference becomes:

$$V_{gate}^{eff}=V_{gate}^{applied}-V_{CPD\_PG}.$$

where $V_{gate}^{eff}$ is the potential the electrons would "see" if $V_{CPD\_PG}$ was zero.

For example, if $V_{CPD\_PG}=2.5V$, then applying a positive voltage of +2.5V to gate 121 is equivalent to applying 0V to the gate when $V_{CPD\_PG}=0$. Taking this into account, the requirements are correctly given in Table 2:

TABLE 2

| $V_{in}$ | $V_{in}^{eff}$ | $V_{out}$ | I |
|---|---|---|---|
| $V_{DD}/2$ | $V_{DD}/2 - V_{CPD\_PG}$ | $V_{DD} + K_{max}/e - V_{CPD\_PA}$ | =0 |
| $V_{DD} + K_{max}/e - V_{CPD\_PA}$ | $V_{DD} + K_{max}/e - V_{CPD\_PA} - V_{CPD\_PG}$ | $V_{DD}/2$ | >0 |

The device properties can be selected according to two additional requirements:

1. For I>0, $V_{in}^{eff}=-K_{max}/e$ This is the lowest gate voltage that does not allow for gate current. It is assumed that in this state an electric current flows through the triode as long as the anode's potential is greater than $V_{CPD\_PA}$.

2. The difference in the gate voltage $V_{in}^{eff}$ between the triode's state 'on' (electric current flows through the triode) and state 'off' (no current flow) is $2 \cdot K_{max}/e$. There is some freedom with regard to this factor, which is also related to geometrical factor $\mu$. It is assumed that in the 'off' state no current flows regardless of the anode voltage, as long as $\mu>1$ and the anode's potential is of the same order of magnitude in both 'on' and 'off' cases.

It should be understood that the numbers themselves can be changed or tuned.

From the first requirement, one obtains that for I>0:

$$V_{in}^{eff}=V_{DD}+K_{max}/e-V_{CPD\_PA}-V_{CPD\_PG}=-K_{max}/e.$$

From the second requirement, one obtains that for I=0:

$$V_{in}^{eff}|_{I>0}-V_{in}^{eff}|_{I=0}=$$

$$=V_{DD}+K_{max}/e-V_{CPD\_PA}-V_{CPD\_PG}-(V_{DD}/2-V_{CPD\_PG})=2*K_{max}/e.$$

This leads to the following results:

$$V_{CPD\_PG}=V_{CPD\_PA}+4*K_{max}/e.$$

$$V_{DD}=2*V_{CPD\_PA}+2*K_{max}/e.$$

A numeric example of property selection for an inverter according to the present invention and in accordance with the above relations is given by: $K_{max}/e=0.25V$, $V_{CPD\_PA}=1.5V$, $V_{CPD\_PG}=2.5V$, $V_{DD}=3.5V$.

Hence, the difference between the work functions of the gate material and the anode material should be 1 eV (e.g. Au and Al, respectively). Plugging these numbers into Table 2, results in the following Table 3:

TABLE 3

| $V_{in}$ [V] | $V_{in}^{eff}$ [V] | $V_{out}$ [V] | I |
|---|---|---|---|
| 1.75 | −0.75 | 2.25 | =0 |
| 2.25 | −0.25 | 1.75 | >0 |

It should be noted that a logic device according to the present invention can be modified to optimize for fast switching and/or low energy consumption. It should also be noted that a device according to the present invention need not be limited to photoemission. As an immediate example, controlled thermal emission may also be used.

Other logical functions can be implemented according to the principles disclosed hereinbefore using, for example, additional gate electrode(s) and reference voltage(s).

Figure 2A:
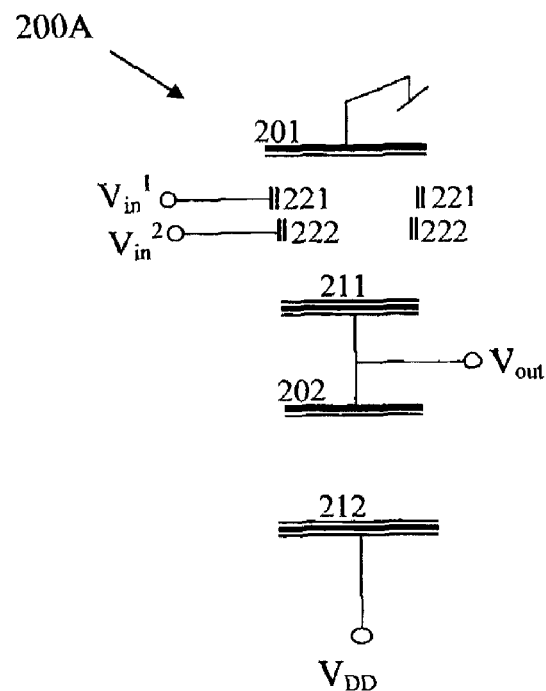
FIGS. 2A and 2B schematically illustrate two examples, respectively, of a device of the present invention operable as a NOR logic gate.
Figure 2B:
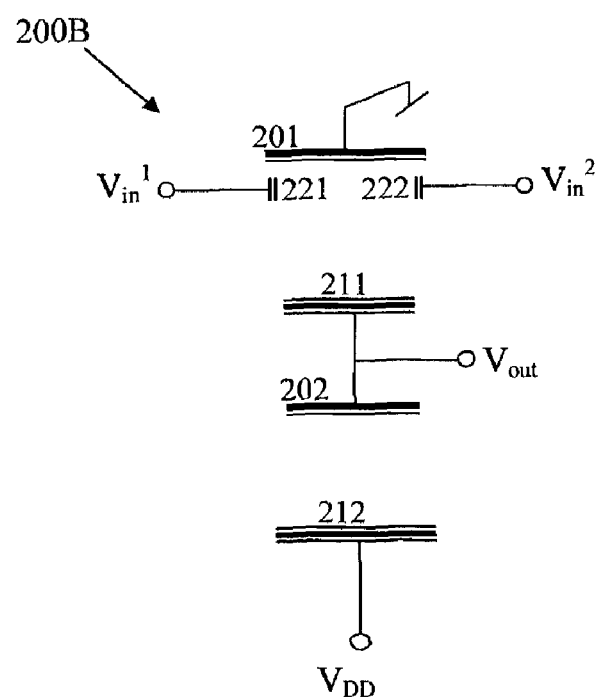

Reference is made to FIGS. 2A and 2B showing two examples of a logical NOR gate device, designated respectively 200A and 200B. Each of devices 200A and 200B includes an electrode arrangement configured generally similar to the device of FIG. 1, namely in which photocathode, anode and gate electrodes are vertically aligned being located in spaced-apart substantially parallel planes, respectively. Each of devices 200A and 200B includes two photocathodes 201 and 202, two anode electrodes 211 and 212, and two gate electrodes 221 and 222. In the example of FIG. 2A, the gates are ring-like electrodes, and in the example of FIG. 2B, each gate forms half of a "ring" whose cross section is shown.

The principles of operation of devices 200A and 200B are generally similar to those described for the inverter of FIG. 1, except that each of devices 200A and 200B includes two gate electrodes allowing for two input voltages, $V_{in}^1$ and $V_{in}^2$, respectively. Both gates are located in the space between photocathode 201 and anode 211, and are placed so that only when both inputs $V_{in}^1$ and $V_{in}^2$ correspond to logical '0' (i.e. the lower of the two voltage values is used), then there is no electric current, I=0, through the device and output voltage $V_{out}$ corresponds to logical '1' (i.e. the higher value). Otherwise, if one or both of $V_{in}^1$ and $V_{in}^2$ is corresponding to '1', then I>0 and $V_{out}$ corresponds to logical '0'. This is summarized in the following Table 5, which describes a NOR gate:

TABLE 5

| $V_{in}^1$ | $V_{in}^2$ | $V_{out}$ | I |
|---|---|---|---|
| '0' | '0' | '1' | =0 |
| '0' | '1' | '0' | >0 |
| '1' | '0' | '0' | >0 |
| '1' | '1' | '0' | >0 |

Figure 3:
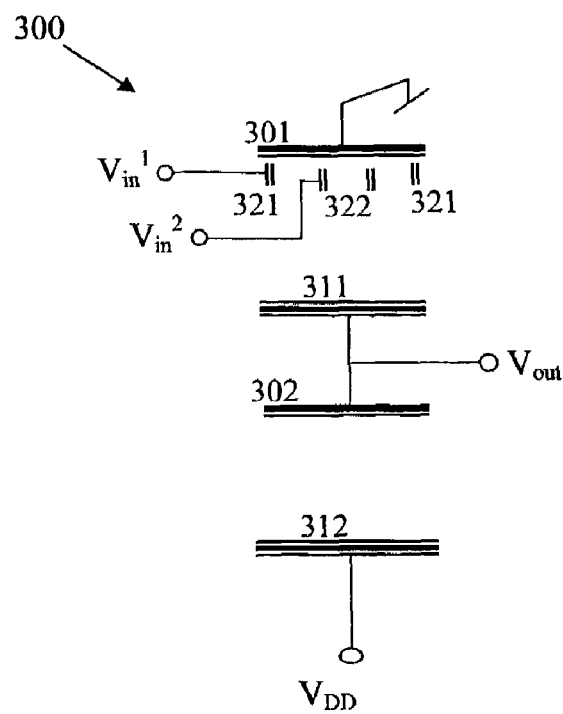
FIG. 3 is a schematic illustration of yet another example of a device of the present invention operable as a NAND gate.

FIG. 3 illustrates yet another example of the present invention. A device 300 is shown being configured to operate as a logical NAND gate. Device 300 includes an arrangement of vertically aligned parallel electrodes (cylindrical geometry) including two photocathodes 301 and 302, two anode electrodes 311 and 312, and two gate electrodes 321 and 322 allowing for two input voltages, Vin1 and Vin2 respectively. Both gates are located in the space between photocathode 301 and anode 311. The gates are assembled as two concentric rings. Only when both inputs Vin1 and Vin2 correspond to logical '1' (i.e. the higher of the two used voltage values), then I>0 through the device and Vout corresponds to '0' (i.e. the lower value). Otherwise, if one or both of Vin1 and Vin2 corresponds to logical '0', then I=0 and Vout corresponds to '1'. This is summarized in the following Table 6, which describes a NAND gate:

TABLE 6

| $V_{in}^1$ | $V_{in}^2$ | $V_{out}$ | I |
|---|---|---|---|
| '0' | '0' | '1' | =0 |
| '0' | '1' | '1' | =0 |
| '1' | '0' | '1' | =0 |
| '1' | '1' | '0' | >0 |

Figure 4:
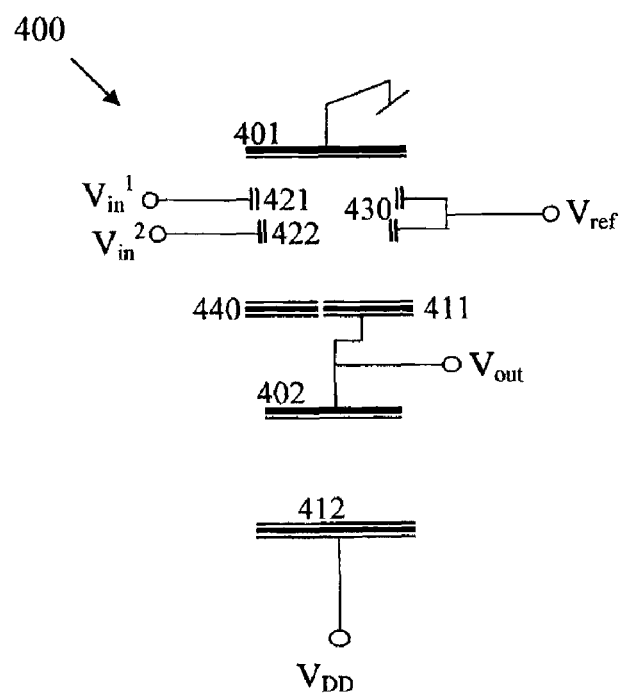
FIG. 4 exemplifies a device of the present invention operable as OR or AND logic gate.

Reference is made to FIG. 4 exemplifying a device 400 that can operate as a logical OR gate or a logical AND gate. The device includes an arrangement of vertically aligned electrodes including two photocathodes 401 and 402, two anode electrodes 411 and 412, two gate electrodes 421 and 422, and a reference voltage electrode (or set of electrodes) 430; and also includes an additional collector electrode ("anode") 440 which may or may not be internally connected to photocathode 401. Both gates 421 and 422, as well as reference electrode(s) 430, are located in the space between photocathode 401 and anode 411, and the gates are placed facing the reference electrode(s). The use of two gate electrodes allows for two input voltages, $V_{in}^1$ and $V_{in}^2$.

It should be noted that this device, in distinction to the previously described examples, utilizes deflection of the emitted electrons. It is therefore necessary to take into consideration energy and velocity distributions of the electrons, as well as the emission area of photocathode 401, when constructing a particular geometry. The essential principles of operation, however, are described herein.

The device functions as a logical OR gate when an applied reference voltage $V_{ref}$ corresponds to logical '0' (the lower value). Let us consider a narrow electron beam emitted from the center of photocathode 401. If both input voltages $V_{in}^1$, and $V_{in}^2$ are corresponding to '0', then the emitted electrons are not deflected and reach anode 411, resulting in a certain electric current I>0 and an output voltage $V_{out}$ corresponding to logical '0'. But if either one of input voltages $V_{in}^1$, $V_{in}^2$, or both of them is/are '1', then the electrons are deflected towards collector electrode 440, resulting in no current flow I=0 and an output voltage $V_{out}$ of '1'. The result is summarized in the following Table 7, which describes an OR logic gate:

TABLE 7

| $V_{in}^1$ | $V_{in}^2$ | $V_{out}$ | I |
|---|---|---|---|
| '0' | '0' | '0' | >0 |
| '0' | '1' | '1' | =0 |
| '1' | '0' | '1' | =0 |
| '1' | '1' | '1' | =0 |

Device 400 functions as an AND gate when the applied reference voltage Vref corresponds to logical '1' (the higher value). Let us consider again a narrow electron beam emitted from the center of photocathode 401. In the operation of this device, non-deflected electrons reach collector 430 rather than anode 411. Therefore, if Vin1 and Vin2 are both '1', and the emitted electrons are not deflected, then I=0 and Vout is '1'. However, if either Vin1, Vin2, or both of them is/are '0', then the electrons are deflected towards anode 411, resulting in I>0 and an output Vout of '0'. The result is summarized in the following Table 8, which describes an AND gate:

TABLE 8

| $V_{in}^1$ | $V_{in}^2$ | $V_{out}$ | I |
|---|---|---|---|
| '0' | '0' | '0' | >0 |
| '0' | '1' | '0' | >0 |
| '1' | '0' | '0' | >0 |
| '1' | '1' | '1' | =0 |

The main difference in the device 400 operation as OR and AND logical gates consists in that in OR gate operation (applied reference voltage $V_{ref}$ corresponds to logical '0') non-deflected electrons reach the anode, whereas in AND gate operation (applied reference voltage $V_{ref}$ corresponds to logical '1'), non-deflected electrons reach the additional collector. The only difference has to do with what happens to electrons that are not significantly deflected. Thus, it is possible to use the same physical device to perform either OR or AND, where the function is changed by changing the reference voltage $V_{ref}$ and using an additional voltage to slightly deflect the emitted electrons towards either the anode or the collector. This additional slight voltage can be added to $V_{ref}$.

Figure 5:
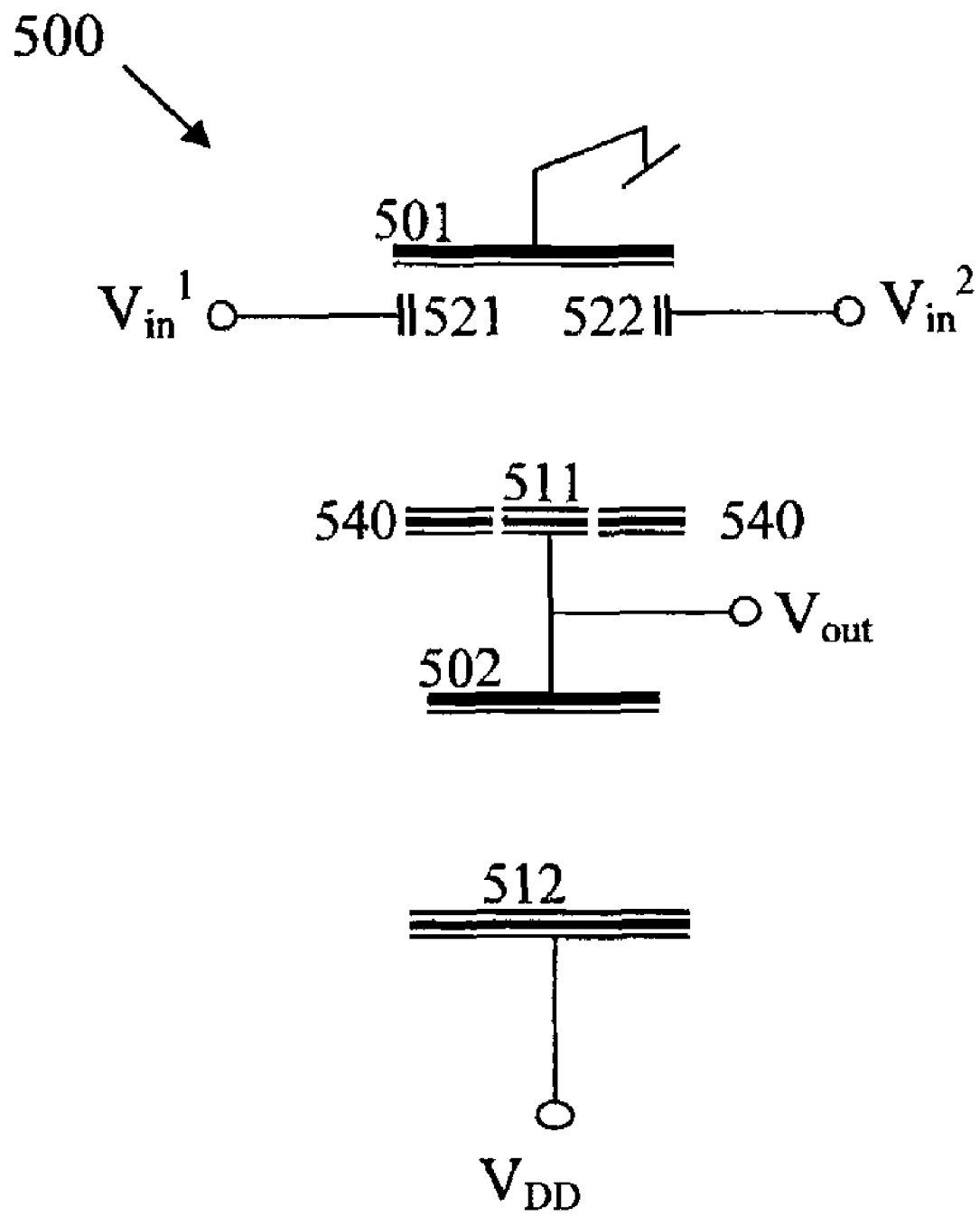
FIG. 5 shows yet further example of a device of the present invention operable as a XOR logic gate.

Reference is made to FIG. 5 which shows an example of a logical XOR gate 500. The device includes two photocathodes 501 and 502, two anode electrodes 511 and 512, two gate electrodes 521 and 522 allowing for two input voltages, $V_{in}^1$ and $V_{in}^2$, and an additional collector electrode 540 which may be internally connected to photocathode 501, where both gates are located in the space between photocathode 501 and anode 511. In this example, collector 540 is a ring-like electrode, and anode 511 is disc-shaped and is placed within the collector's ring. This device also utilizes deflection of the emitted electrons as in the previously described example.

Let us consider a narrow electron beam emitted from the center of photocathode 501. If input voltages $V_{in}^1$ and $V_{in}^2$ are both corresponding to logical '0' or both corresponding to logical '1', then the emitted electrons are not deflected and thus reach anode 511, resulting in I>0 and $V_{out}$='0'. But if $V_{in}^1$, and $V_{in}^2$ are different, i.e. one is '0' and the other is '1', then the electrons are deflected towards collector 540, resulting in I=0 and $V_{out}$='1'. This is summarized in the following Table 9, which describes a XOR gate:

TABLE 9

| $V_{in}^1$ | $V_{in}^2$ | $V_{out}$ | I |
|---|---|---|---|
| '0' | '0' | '0' | >0 |
| '0' | '1' | '1' | =0 |
| '1' | '0' | '1' | =0 |
| '1' | '1' | '0' | >0 |

It is thus shown that the present invention provides a simple technique to manufacture and operate logic gate device that can utilize the advantages of vacuum tube technology. The device of the present invention utilizes an electrode arrangement implementing the principles of photo- or thermo-emission. It should be understood that an illumination or temperature source may or may not be a constructional part of the logic gate device. The electrode arrangement is formed by at least two cathodes and their respective anodes and at least one gate. The electrons' propagation through the device is affected by input voltage(s) to selectively provide a certain retarding field resulting in either a certain non-zero current or substantially no electric current through the device; or in some other embodiments by selectively providing deflection of electrons form a path towards the anode.

In some other embodiments of the logic device of the present invention, the device is configured to vary an electric field within a cathode-anode cavity by appropriate voltage input on a plurality of gates to thereby affect an electric signal at the anode.

Figure 6:
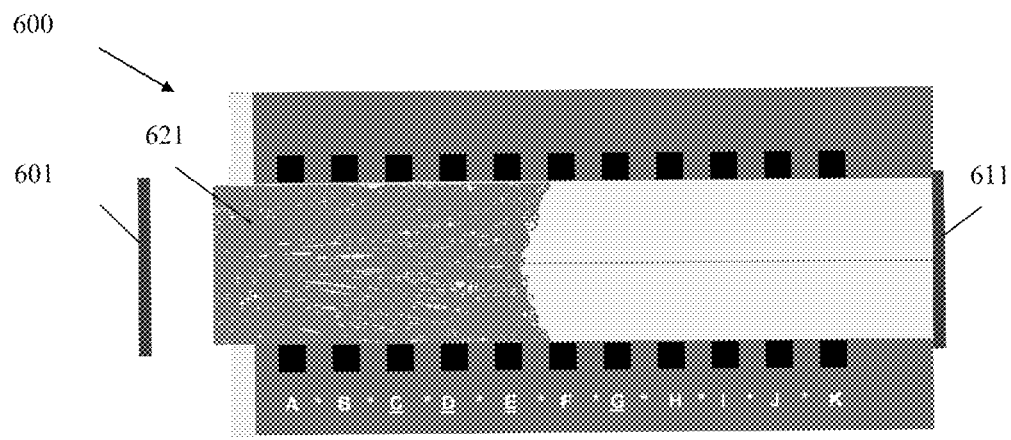
FIG. 6 exemplifies a logic device according to another embodiment of the invention.

Reference is made to FIG. 6 illustrating a configuration of an example of such a logic device 600. The device 600 comprises a photocathode 601, an anode 611, and an array of gates denoted by letters A-K arranged in a spaced-apart relationship along a cavity between the photocathode and anode. The gates may be selectively supplied with predefined voltages, such as those defined as LOW and HIGH (which correspond to the two Boolean values).

It should be understood that the terms "HIGH potential" and "LOW potential" refer to any two distinct potential values or ranges, that logically correspond to the two Boolean values '0' and T. For example, in some embodiments disclosed herein, the "HIGH potential" is equal to the maximal kinetic energy of the emitted electrons (e.g., 0.2V), and the "LOW potential" is zero. However, this is essentially equivalent to a definition of the "LOW potential" as minus the maximal kinetic energy of emission (e.g., (−0.2) V), and of the "HIGH potential" as zero. In general, an arbitrary potential may be added to both "HIGH" and "LOW" potentials without affecting the behavior. This is because the potential differences are of interest, not the potentials' absolute values.

It should be noted that implementing a gate requiting a large "fan-in" (many inputs) using standard CMOS may require multiple levels of standard gates, each gate having a limited number of inputs. There are other gate designs, for example pseudo-nMOS gates, that require only one transistor per input. Pseudo-nMOS gates permit a reduction in the gate size, a reduction in the gate delay time (by implementing a logic function in a single level), and a reduction in complexity relative to standard CMOS gates but typically at the expense of an increase in power relative to standard CMOS. Therefore future complexity increments using CMOS are problematic.

The input signal voltages applied to the plurality of gates affect the electric field profile in the cavity, which in turn affects an electric current through the cavity and an electric output at the anode. The operation of the first cathode-anode unit of the devices 100,200,300,400,500 is generally similar to that of device 600, differing therefrom that the output of device 600 is not defined to where the device is connected: the device can be connected either to another diode (as exemplified above with reference to FIG. 1) or to a CMOS transistor structure. In the latter case, the anode should be pre-charged to a certain positive voltage compared to the photocathode (similar to a standard mechanism used in CMOS-based logic devices) prior to performing the calculation (the logic operation). It should be noted that this dual mode of operation of device 600 is also possible for the first cathode-anode unit of the above-described devices 100-500, i.e. the anode of the first cathode-anode unit may be connected to a CMOS structure instead of being connected to a second cathode-anode unit.

Figure 7:
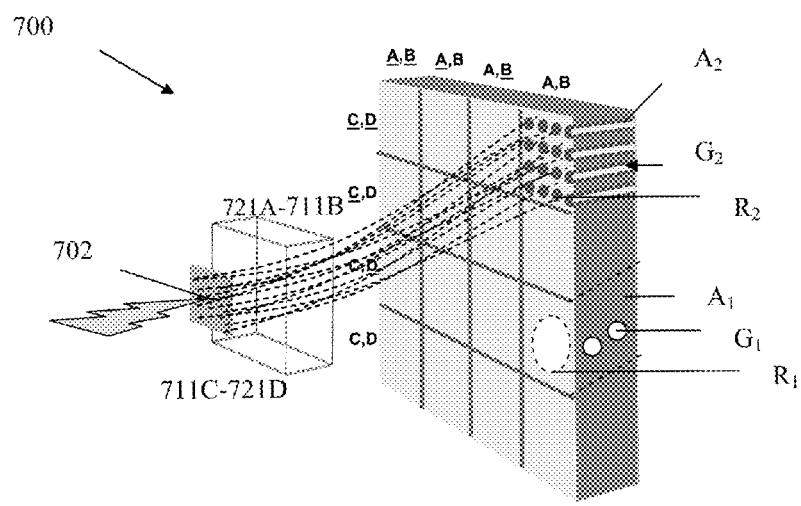
FIG. 7 exemplifies a logic device according to yet another embodiment of the invention.

Reference is now made to FIG. 7 exemplifying a logic device generally at 700 according to yet another embodiment of the invention. The device 700 includes a photocathode 702 (exposed to illumination), an arrangement of gates, and an anode 711. The anode 711 is a segmented unit defining a two-dimensional array of anode segments. The arrangement of gates is configured to operate as a deflector of electrons' flow emitted from the photocathode to appropriately affect the electrons' path. In the present non-limiting example, the arrangement of gates includes two pairs of gates 721A-711B and 711C-721D, each associated with one of the two perpendicular axes, and allowing four input bits. The electron beam is deflected according to the values of the input bits. For example, if all the input bits are '0', then the beam will reach the anode segment at the top left corner of the anode. If all the input bits are '1', the beam will reach the bottom right corner segment of the anode. Any other individual combination of inputs will deflect the beam to an individual anode segment, respectively. This enables for creating the device output in the form of any logic function (e.g., AND, XOR, etc.) of inputs (Boolean values).

To perform a specific logic function, all the anode segments representing '1' are connected (wired) to form an output. For example, to perform an AND function, the most bottom right pixel is selected as the output, because the beam will reach that pixel only if all inputs are '1'.

Thus, the output of device 700 is defined by connecting together the anode segments which represents the logical function to be implemented. If, for example, the following function is to be implemented: f(a,b,c,d)=a.b.c.d+a.b.c.!d (meaning (a & b & c & d) OR (a & b & c & (not d))), then two anode segments (pixels) that correspond to the divergence (deflection) of the beam in these two cases should be connected together, the electric current coming from this connection should be measured. If the electric current I is higher than zero, then the result of the calculation is '1'. If the electric current I is equal to zero, then the result of the calculation is '0'. It should be noted that the interpretation of I>0 to logical '1' is arbitrary and can be vice versa. In that manner, any logical function can be implemented.

It should also be noted that it is possible to have several sets of outputs (i.e., several sets of anodes connected together) representing several functions calculated together on the same device. For example, if all the segments (pixels) are connected together and one segment of the corner represents an AND function, then the functions AND and NAND can be obtained in the same device. In the same way, more complicated functions may be implemented together. Therefore, by appropriately wiring the corresponding anode segments the device of the present invention implements any logical function.

As also illustrated in FIG. 7, each of the anode segments may additionally be associated with one or more arrays of gates extending along the cavity axis. This allows for increasing the variety and complexity of logic functions that can be performed by the device. Practically, this can be implemented by making a groove within the anode-segment substrate to define an anode cavity. Two different examples of such additional embodiments are shown schematically in the figure with respect to anode-segments $A_1$ and $A_2$. As shown, anode segment $A_1$ is formed with a circular groove, and an array of gates $G_1$ (e.g. ring-like electrodes) arranged along the groove aside thereof. Using more than one such groove-with-gates in the anode-segment allows for even more variety and/or complexity of logic functions. As exemplified with respect to anode segment A2, it is formed with a two-dimensional array of sixteen such grooves, generally at $R_2$, each associated with an array of gates, generally at $G_2$.

For example, the functions $f_1(a,b,c,d,g,h)=(a.b.c.d.!(g.h))$, $f_2(a,b,c,d,e,f,g,h)=(a.b.c.!d.!(e+f+g+h))$ can both be implemented in a single device of the present invention as follows:

In general, the calculation regarded a,b,c,d operands is done by the deflection section of the device (photocathode and arrangement of gates) where the rest of the function is done by the second section (segmented anode). The first function, $f_1=(a.b.c.d.(g+h))$ is calculated as follows: a.b.c.d is calculated on a specific pixel of the gates arrangement close to the photocathode in the deflection stage's output. The function !(g.h) is calculated by two gates in the anode cavity of a specific segment, where the g and h wires are connected to said gates, which is generally similar to the example of FIG. 4, but in the configuration of FIG. 7. These The current in the anode after these two gates represents the result of the calculation.

The second function, $f_2=(a.b.c.!d.!(e+f+g+h))$, is calculated as follows: a.b.c.!d is done by a specific segment of the deflection section of the device (photocathode and arrangement of gates) at the deflection stage's output. The !(e+f+g+h) is calculated by four gates in the cavity (generally similar to the example of FIG. 2B), in that specific segment, where the e, f, g, and h wires are connected to said gates. The current in the anode after these four gates represents the result of the calculation.

The inventors have compared the operation of the device of the present invention, e.g. that of FIGS. 1, 6 and 7, and a conventional CMOS-based DSP core CPU. The comparison results are presented in Table 10 below:

TABLE 10

|  | CMOS-based DSP core | Same DSP core based on a photocathode-anode unit with one or more gates |
|---|---|---|
| Power per Flip-Flop | 53 µW | 54 µW |
| Power per DSP core | ~700 mW | ~700 mW |

Figure 8:
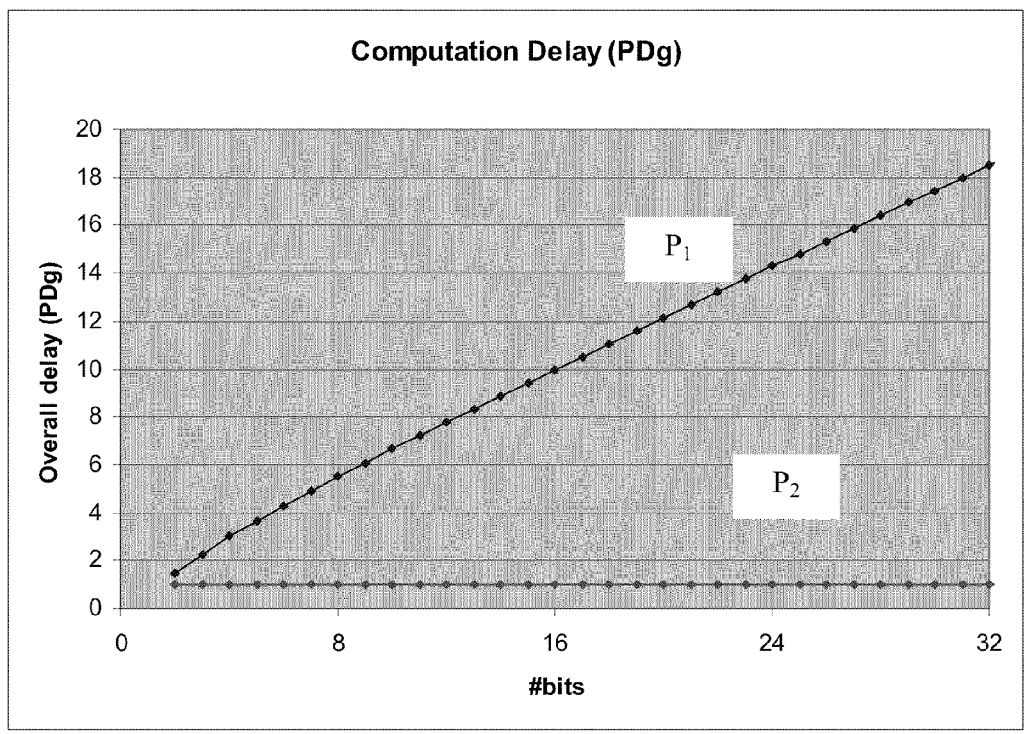
FIG. 8 compares performance of the logic device of the present invention to that of a CMOS-based device implementing a similar logic function.

The device of the present invention implements a very wide fan-in (>10 inputs). The device having a wide-gate logic computes with fewer propagating stages, is faster and more power efficient. Referring to FIG. 8, comparing the device of the present invention to the CMOS-based logic device, two graphs are shown presenting a time delay in the device response as a function of a number of input signals (bits): graph $P_1$ corresponds to the CMOS-based device and graph $P_2$ corresponds to the device of the present invention. As seen in the figure, the fan-in of the CMOS-based device is limited, and the greater the complexity (i.e. the higher the number of input bits) the greater the delay. This would unavoidably result in more required power, more footprint of the device, and higher cost. While the technique of the present invention provides the same, relatively low, delay in the device response (and accordingly maintaining the small footprint and power requirements) regardless of the number of input bits.

The device of the present invention enables the performance of macro-functions like correlation, convolution, list-processing etc. Comparing the device of the present invention to the conventional ones, the device of the present invention provides for reducing power, reducing silicon real-estate, increasing processing capacity for constant power and provides for achieving more functions per time units. The composite is neutral in power and advantageous in footprint when contemporary structures are analyzed. The device composes more complex "super-instruction" structures. As detailed above, in the general case of DSP-core operations, the device does logic as well as CMOS and is not thermally limited like CMOS-based device. It should be understood that that the advantages of the device of the present invention over the CMOS-based devices is even more essential in the logic device of higher complexity.

While this invention has been particularly shown and described with references to preferred embodiments thereof, it will be understood by those skilled in the art that various changes in form and details may be made therein without departing from the scope of the invention encompassed by the appended claims.

What is claimed is:

1. An electronic device for performing at least one logic function, the device comprising: an electron emission based electrode arrangement associated with an electron extractor, the electrode arrangement comprising at least one basic unit, said basic unit comprising: a photocathode, an anode, and one or more gates arranged in one or more planes between the photocathode and the anode planes, wherein said one or more gates are connectable to a voltage supply unit to be operated by one or more input voltages signals corresponding to one or more logical values, respectively, and one of said photocathode and anode is connected to a controllable voltage supply and the other of said photocathode and anode is operable as a floating electrode from which an electrical output of the device indicative of a resulted logic function is read, and is electrically connected to an electrode of another cathode-anode unit, or to an electrode of another electronic device.

2. The device according to claim 1, wherein the input signal is output of another electronic device.

3. The device according to claim 1, wherein said anode is the floating electrode and is electrically connected to an additional cathode which is exposed to the electron extractor and is associated with an additional anode.

4. The device according to claim 3, wherein the at least one input voltage on the at least one gate affects an electric current flow from the additional cathode to its associated anode thereby affecting the device output.

5. The device according to claim 3, wherein the one or more input voltages to the one or more gates determine the logic function to be performed by the device, and the configuration of a unit formed by the additional cathode and anode determines the device output, such that the output voltage values corresponding to the logical values '0' and '1' and the input voltage values corresponding to the same logical values, are the same.

6. The device according to claim 3, wherein a potential voltage is maintained between the cathode and the additional anode.

7. The device according to claim 3, wherein said electrode arrangement comprises triode and diode structures, the triode structure being formed by said cathode, anode and gate therebetween, and the diode structure is formed by said additional cathode and anode, the device being operable as an inverter.

8. The device according to claim 3, wherein said electrode arrangement comprises two gates for supplying thereto the same or different input voltages corresponding to the same or different logic states.

9. The device according to claim 8, wherein the two gates are arranged with respect to each other and with respect to the first cathode-anode unit so as to enable the device operation as either one of NOR, NAND, OR and AND logic gate.

10. The device according to claim 9, wherein the gates are ring-like electrodes.

11. The device according to claim 1, wherein the one or more cathodes are photocathodes associated with an illumination unit of the electron extractor.

12. An electronic device for performing at least one logic function, the device comprising: an electron emission based electrode arrangement associated with an electron extractor, the electrode arrangement comprising at least one basic unit including a photocathode, an anode, and one or more gates arranged in one or more planes between the photocathode and the anode planes, wherein said one or more gates are connectable to a voltage supply unit to be operated by one or more input voltages signals corresponding to one or more logical values, respectively, and one of said photocathode and anode is operable as a floating electrode from which an electrical output of the device indicative of a resulted logic function is read, and is electrically connected to an electrode of another cathode-anode unit, or to an electrode of another electronic device:
 wherein said anode is the floating electrode and is electrically connected to an additional cathode which is exposed to the electron extractor and is associated with an additional anode,
 wherein said electrode arrangement comprises two gates for supplying thereto the same or different input voltages corresponding to the same or different logic states,
 wherein the two gates are arranged with respect to each other and with respect to the first cathode-anode unit so as to enable the device operation as either one of NOR, NAND, OR and AND logic gate, and
 wherein the gates electrodes are configured as half-ring electrodes located in a spaced-apart relation substantially in the same plane between the first cathode and its associated anode, the device being operable as a NOR logic gate.

13. An electronic device for performing at least one logic function, the device comprising: an electron emission based electrode arrangement associated with an electron extractor, the electrode arrangement comprising at least one basic unit including a photocathode, an anode, and one or more gates arranged in one or more planes between the photocathode and the anode planes, wherein said one or more gates are connectable to a voltage supply unit to be operated by one or more input voltages signals corresponding to one or more logical values, respectively, and one of said photocathode and anode is operable as a floating electrode from which an electrical output of the device indicative of a resulted logic function is read, and is electrically connected to an electrode of another cathode-anode unit, or to an electrode of another electronic device;
 wherein said anode is the floating electrode and is electrically connected to an additional cathode which is exposed to the electron extractor and is associated with an additional anode, and
 comprising a reference electrode for supplying thereto a voltage value corresponding to either one of logic values '0' and '1' and a collector electrode located aside the first anode, thereby providing selective deflection of the emitted electrons towards the collector resulting in the zero electric current at the first anode, the device thereby operating as either one of OR and AND logic gates.

14. An electronic device for performing at least one logic function, the device comprising: an electron emission based electrode arrangement associated with an electron extractor, the electrode arrangement comprising at least one basic unit including a photocathode, an anode, and one or more gates arranged in one or more planes between the photocathode and the anode planes, wherein said one or more gates are connectable to a voltage supply unit to be operated by one or more input voltages signals corresponding to one or more logical values, respectively, and one of said photocathode and anode is operable as a floating electrode from which an electrical output of the device indicative of a resulted logic function is read, and is electrically connected to an electrode of another cathode-anode unit, or to an electrode of another electronic device;
 wherein said anode is the floating electrode and is electrically connected to an additional cathode which is exposed to the electron extractor and is associated with an additional anode, and
 comprising a collector electrode located aside the first anode, thereby providing selective deflection of the emitted electrons towards the collector resulting in the zero electric current at the first anode.

15. The device according to claim 14, wherein said collector electrode is a ring-like electrode surrounding the first anode, the device being operable as XOR logic gate.

16. An electronic device for performing at least one logic function, the device comprising: an electron emission based electrode arrangement associated with an electron extractor comprising a first unit including at least one cathode, at least one anode, and at least one gate, and a second unit including at least one cathode and at least one anode; said at least one gate being operated by an input voltage corresponding to at least one logical value respectively; the cathode of the first unit being connected to a controllable voltage supply, said anode of the first unit and the cathode of the second unit being electrically connected to each other and being a floating electrode from which an electrical output of the device is read indicative of an electric current flowing through the device in response to the applied at least one input voltage.

17. An electronic device for performing multiple logic functions, the device comprises one or more basic units, each basic unit comprising a photocathode associated with an electron extractor, an anode, and an arrangement of gates comprising a plurality of gates arranged in a spaced-apart relationship along at least one axis of a cavity between the photocathode and anode, the photocathode being connected to a controllable voltage supply and the anode being a floating electrode, thereby allowing multiple different combination of input signals applied as input voltages on the gates affecting an electric field within the cavity accordingly, thereby affecting an electric output at the anode corresponding to a respective logic function of the input signals.

18. The device according to claim 17, wherein said anode is a gate electrode of another electronic device.

19. The device according to claim 17, wherein the arrangement of gates at least one of the following configurations: (i) comprises a one-dimensional array of gates extending along the cavity; (ii) comprises a first array of gates spaced-apart along a first axis, and a second array of gates spaced-apart along a second axis, the first and second axes being substantially perpendicular to the cavity axis, said arrangement of gates operating as a deflector for electrons emitted from the photocathode, thereby affecting the electrons' path in accordance with the applied input voltages; and (iii) is located closer to the photocathode plane.

20. The device according to claim 17, wherein the anode is a segmented electrode defining an array of anode segments, the deflection of the electrons according to the input voltages on the gates directing the electrons to the selected one or more anode segments.

21. The device according to claim 20, wherein the output of the device is defined by connecting said anode segments representing the logical function to be implemented.

22. The device according to claim 20, wherein the anode segments have one of the following configurations: (a) each of at least some of the anode segments is associated with a plurality of the gates, the gates being arranged in at least one array of gates extending along the cavity close to the anode plane, enabling to increase the variety and complexity of the logic function performed by said device; and (b) the anode segment is associated with at least one anode cavity with the corresponding array of gates extending along said anode cavity.

23. An electronic device for performing multiple logic functions, the device comprises a deflection device including a cathode associated with an electron extractor and connected to a controllable voltage supply, an arrangement of gates comprising a plurality of gates arranged in a spaced-apart relationship along at least one axis of a cavity between the photocathode and a floating anode, thereby allowing multiple different combination of input signals applied as input voltages on the gates affecting an electric field within the cavity accordingly, and segmented anode defining an array of anode segments, the deflection of the electrons being according to the input voltages on the gates directing the electrons to the selected one or more anode segments.

24. An electronic device for performing at least one logic function, the device comprising: an electron emission based electrode arrangement associated with an electron extractor, the electrode arrangement comprising at least one basic unit including a photocathode, an anode, and two gates arranged in one or more planes between the photocathode and the anode planes, wherein said two gates are connectable to a voltage supply unit for supplying thereto the same or different input voltages corresponding to the same or different logic, respectively, and said anode is operable as a floating electrode from which an electrical output of the device indicative of a resulted logic function is read, and is electrically connected to a cathode of another cathode-anode unit or another electronic device which is exposed to the electron extractor and is associated with an additional anode, said two gates being are configured as half-ring electrodes located in a spaced-apart relation substantially in the same plane between the first cathode and its associated anode, the device being operable as a NOR logic gate.

25. An electronic device for performing at least one logic function, the device comprising: an electron emission based electrode arrangement associated with an electron extractor, the electrode arrangement comprising at least one basic unit including:
a photocathode, an anode, and one or more gates arranged in one or more planes between the photocathode and the anode planes, wherein said one or more gates are connectable to a voltage supply unit to be operated by one or more input voltages signals corresponding to one or more logical values, respectively, and said anode is operable as a floating electrode from which an electrical output of the device indicative of a resulted logic function is read, and is electrically connected to an additional cathode of another cathode-anode unit or another electronic device which is exposed to the electron extractor and is associated with an additional anode, and
a reference electrode for supplying thereto a voltage value corresponding to either one of logic values '0' and '1' and a collector electrode located aside the first anode, thereby providing selective deflection of the emitted electrons towards the collector resulting in the zero electric current at the first anode, the device thereby operating as either one of OR and AND logic gates.

26. An electronic device for performing at least one logic function, the device comprising: an electron emission based electrode arrangement associated with an electron extractor, the electrode arrangement comprising at least one basic unit including:
a photocathode, an anode, and one or more gates arranged in one or more planes between the photocathode and the anode planes, wherein said one or more gates are connectable to a voltage supply unit to be operated by one or more input voltages signals corresponding to one or more logical values, respectively, and said anode is operable as a floating electrode from which an electrical output of the device indicative of a resulted logic function is read, and is electrically connected to an additional cathode of another cathode-anode unit or another electronic device which is exposed to the electron extractor and is associated with an additional anode, and
a collector electrode located aside the first anode, thereby providing selective deflection of the emitted electrons towards the collector resulting in the zero electric current at the first anode.

* * * * *